United States Patent [19]

Suematsu et al.

[11] Patent Number: 5,095,542
[45] Date of Patent: Mar. 10, 1992

[54] APPARATUS FOR CONTROLLING TRANSMISSION OUTPUT LEVEL FOR BURST SIGNAL

[75] Inventors: Takayuki Suematsu, Neyagawa; Yoshio Horiike, Katano; Hiroaki Kosugi, Hirakata, all of Japan

[73] Assignee: Matsushita Electric Industrial Co., Ltd., Osaka, Japan

[21] Appl. No.: 546,758

[22] Filed: Jul. 2, 1990

[30] Foreign Application Priority Data

Jul. 5, 1989 [JP] Japan .................. 1-174514

[51] Int. Cl.⁵ ............................ H04B 1/04
[52] U.S. Cl. ..................... 455/127; 455/89; 455/343
[58] Field of Search ............ 455/12, 115, 117, 127, 455/343, 89, 249

[56] References Cited

U.S. PATENT DOCUMENTS

| | | | |
|---|---|---|---|
| 4,731,866 | 3/1988 | Muratani et al. | 455/12 |
| 4,856,082 | 8/1989 | Kasa | 455/249 |
| 4,994,757 | 2/1991 | Bickley et al. | 455/127 |

FOREIGN PATENT DOCUMENTS

| | | |
|---|---|---|
| 60-41821 | 3/1985 | Japan . |
| 61-290809 | 12/1986 | Japan . |
| 63-97020 | 4/1988 | Japan . |

Primary Examiner—Curtis Kuntz
Attorney, Agent, or Firm—Stevens, Davis, Miller & Mosher

[57] ABSTRACT

An apparatus for controlling a transmission output level for a burst signal which is used in a communication of the TDMA system in which a transmission output level can be arbitrarily set. The apparatus comprises a variable gain amplifier whose gain can be varied by a control voltage which is inputted to a control terminal; a variable gain amplifier whose gain can be varied by a control voltage which is inputted to a control terminal; a detecting circuit in which the variable gain amplifiers and are cascade connected to an input terminal to which a signal of a predetermined amplitude is inputted and to which an output electric power of the amplifier at the post stage is inputted and which extracts and detects a part of a voltage which is proportional to the output electric power; an attenuator which receives the voltage detected by the detecting circuit and can output at an arbitrary attenuation ratio; a reference waveform generating apparatus for outputting an envelope for a burst signal; a comparison amplifier which amplifies a different voltage between an output voltage of the attenuator and an output voltage of the reference waveform generating apparatus and whose output is connected to the control terminal of the variable gain amplifier; a control unit for controlling the control voltage of the variable gain amplifier and the attenuation ratio of the attenuator; and an output terminal for outputting a burst waveform from the detecting circuit.

6 Claims, 7 Drawing Sheets

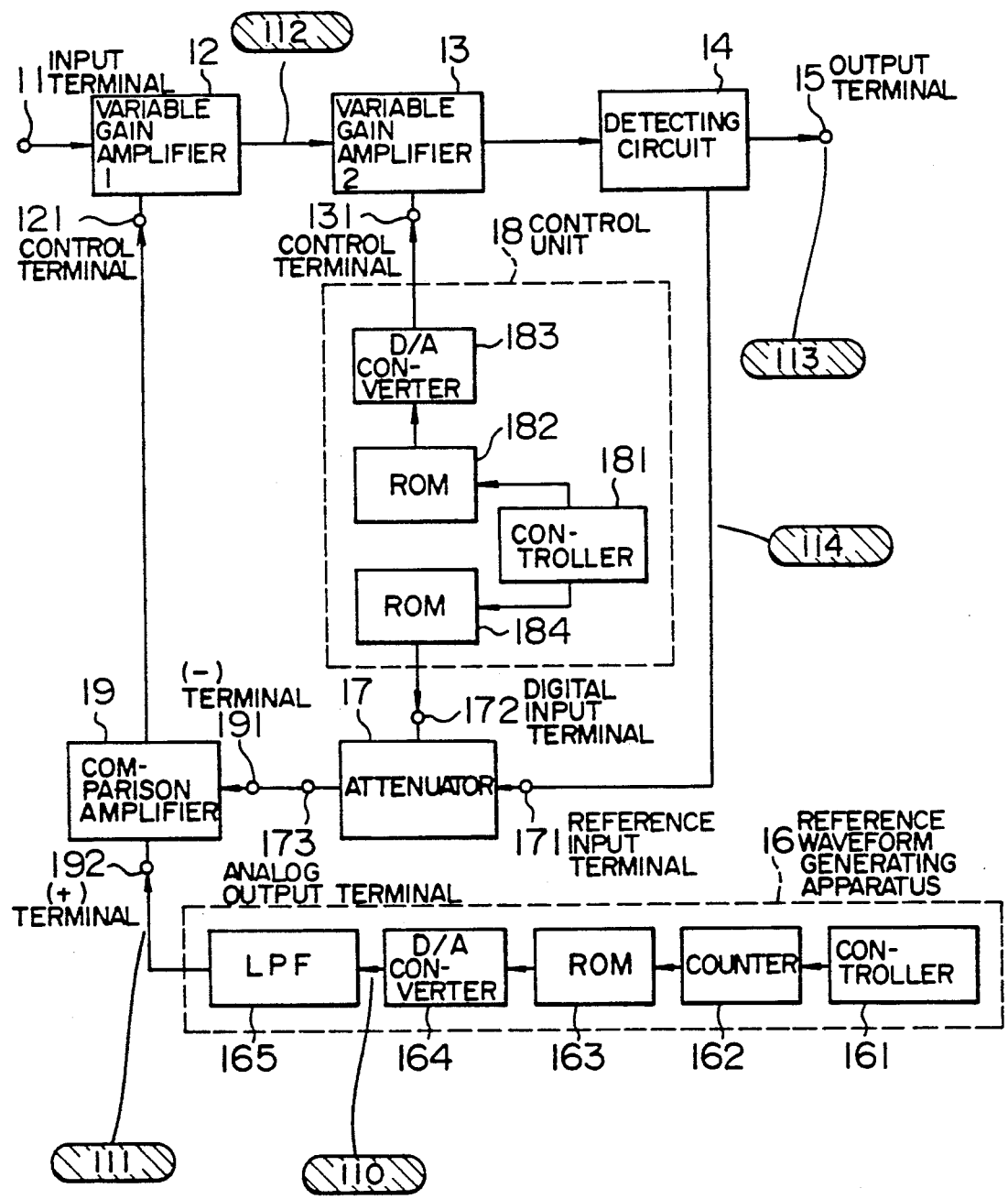
FIG. 1 FIRST EMBODIMENT
NOTE) OUTPUT WAVEFORMS IN RESPECTIVE SECTIONS OF 110, 111, 112, 113, AND 114 ARE SHOWN IN FIG. 5

FIG. 2 GAIN CHARACTERISTICS VS CONTROL VOLTAGE OF GAIN AMPLIFIER 1
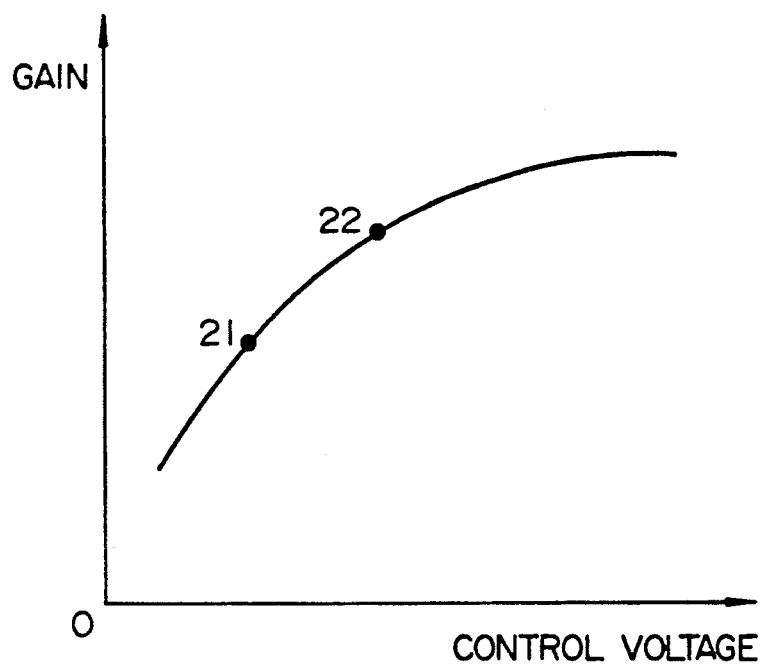
FIG. 3 GAIN CHARACTERISTICS VS CONTROL VOLTAGE OF GAIN AMPLIFIER 2
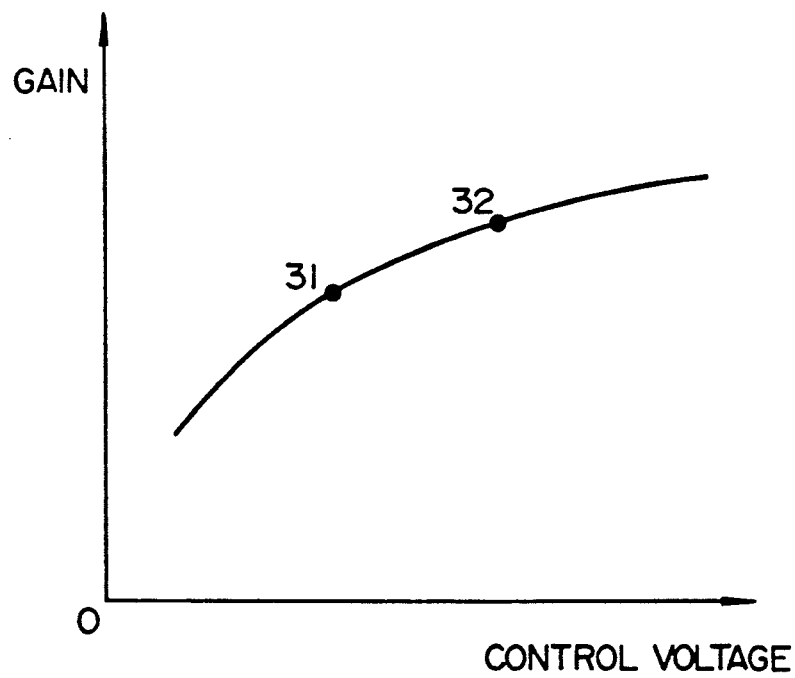

FIG. 4  BURST SIGNAL WAVEFORM SHAPING
WHEN TRANSMISSION OUTPUT IS VARIABLE
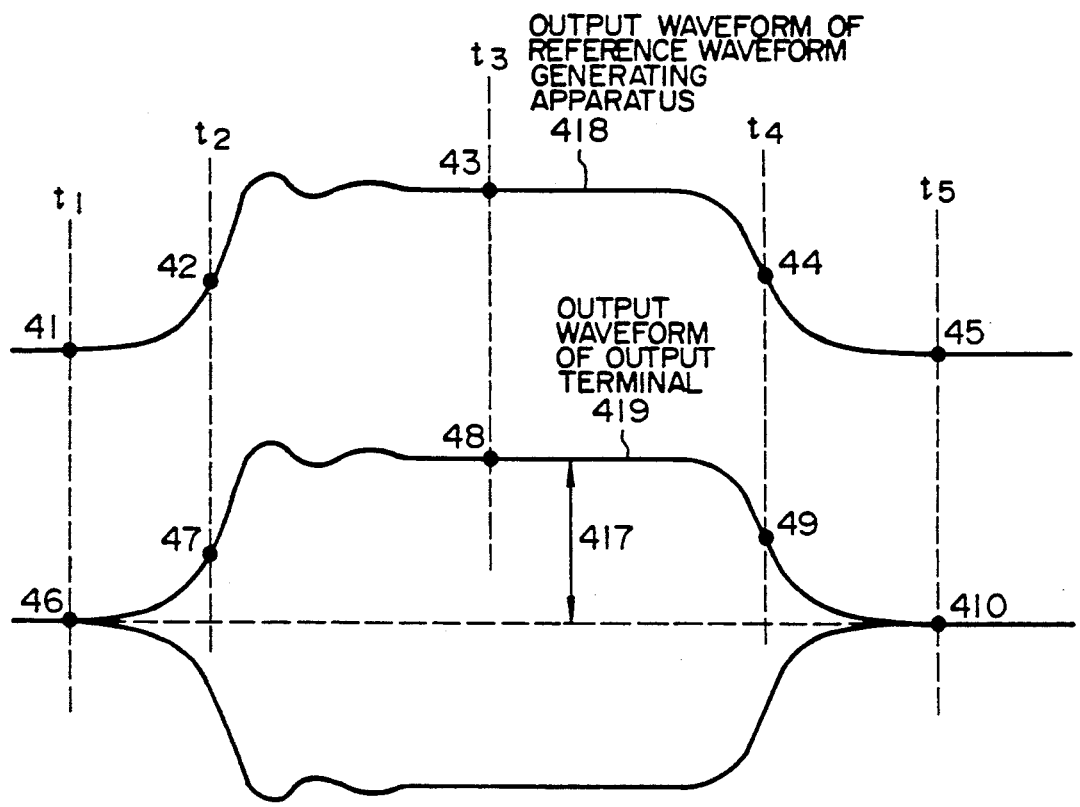
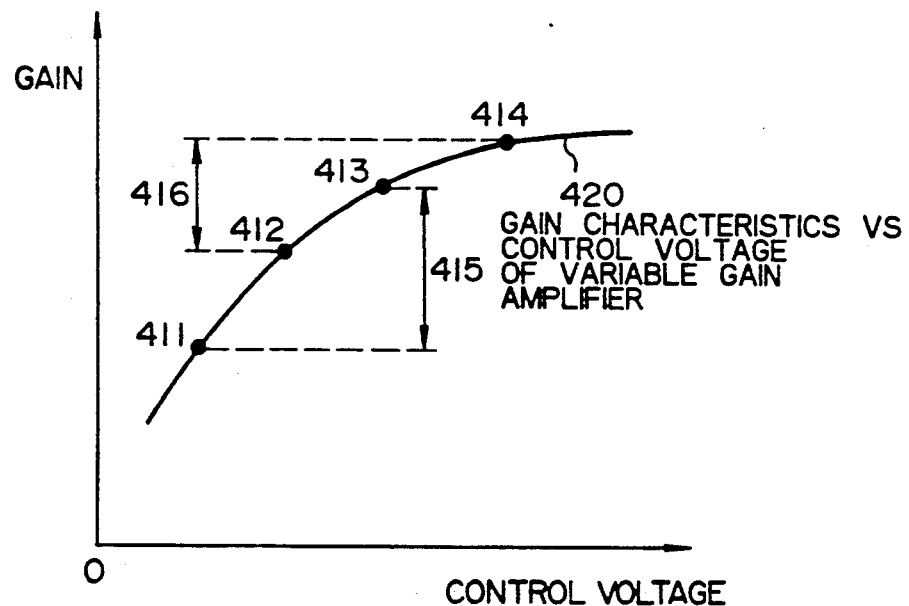

FIG. 5 OUTPUT WAVEFORMS IN RESPECTIVE SECTIONS IN FIG. 1
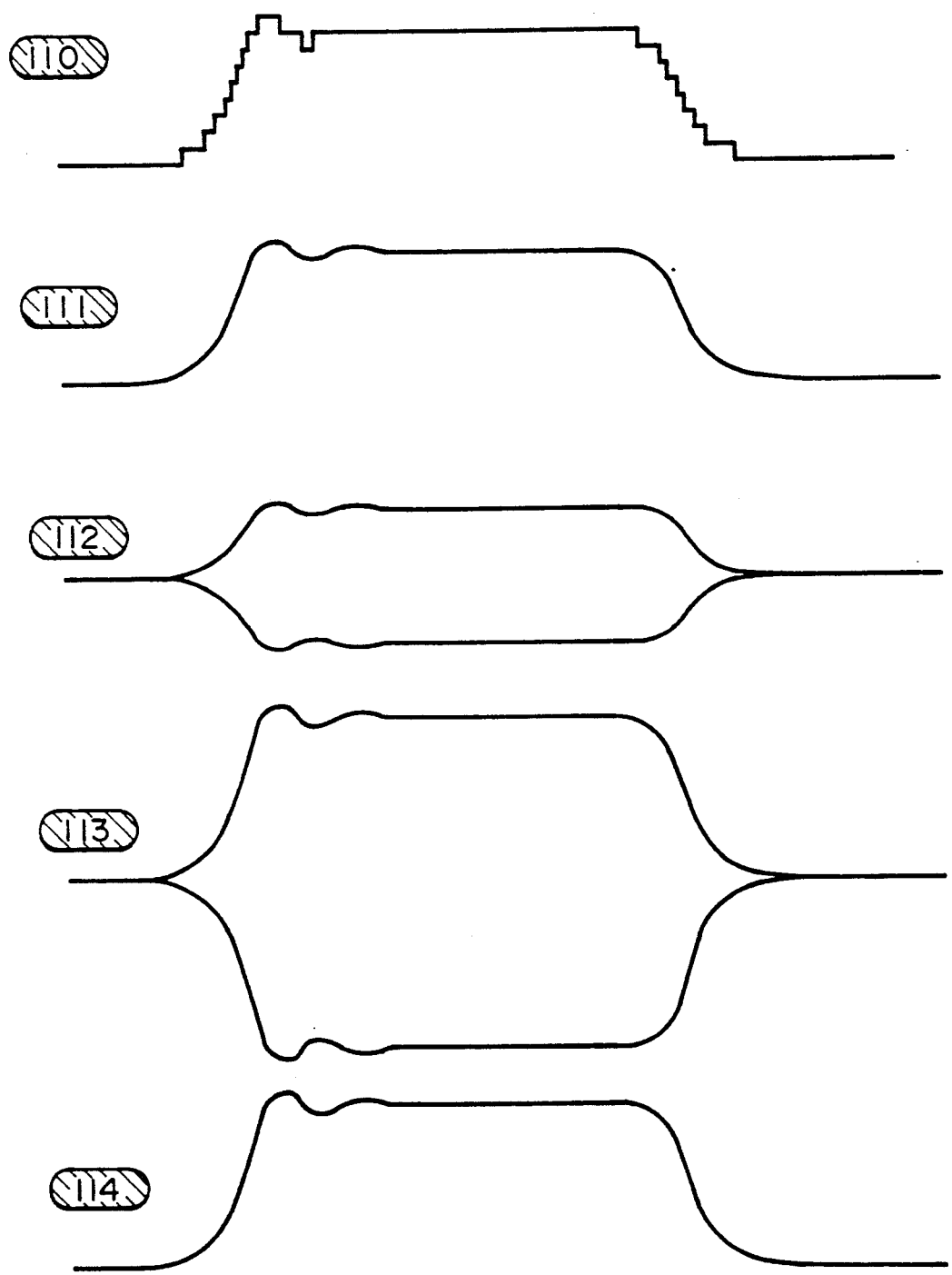

ALC APPARATUS

FIG. 7 OUTPUTS IN RESPECTIVE SECTIONS UPON SHAPING OF BURST SIGNAL
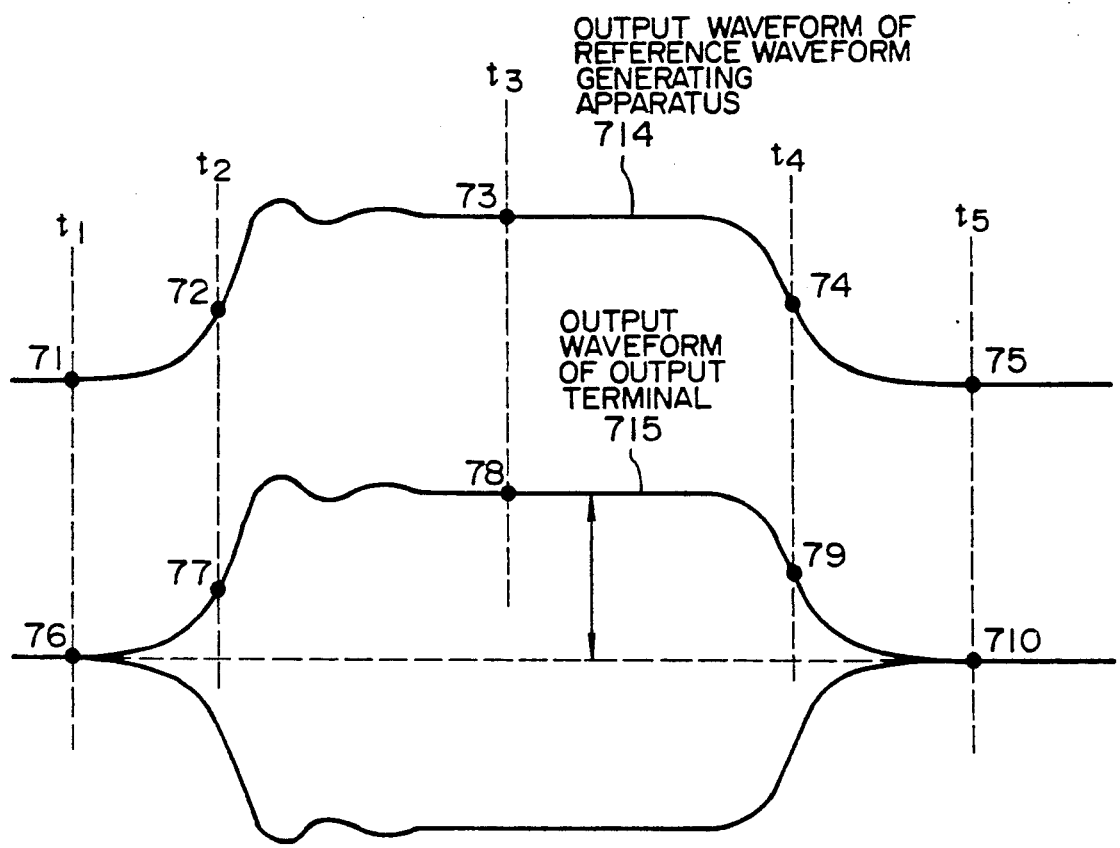
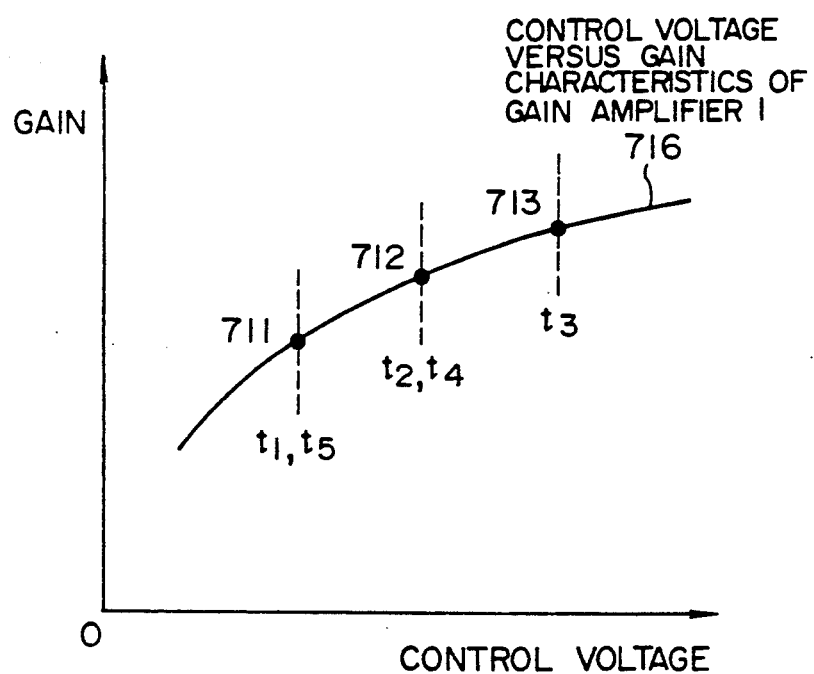

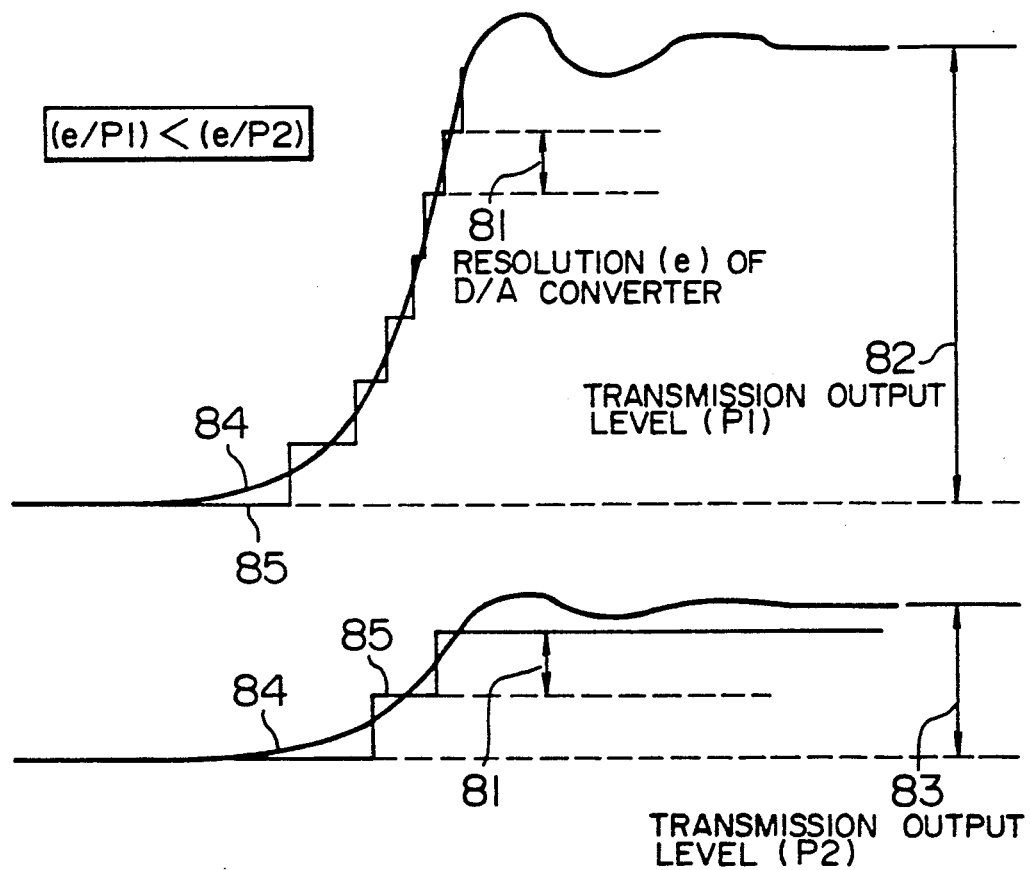

APPARATUS FOR CONTROLLING TRANSMISSION OUTPUT LEVEL FOR BURST SIGNAL

BACKGROUND OF THE INVENTION

In a recent digital telephone for automobile, there is used a method in which a portable telephone changes a transmission output level in accordance with the distance between the portable telephone and a base station in order to efficiently use an electric power of the portable telephone and to reduce a burden of the base station.

The present invention relates to an apparatus for controlling a transmission output level for a burst signal which is used in a communication of the TDMA system in which the transmission output level can be arbitrarily set.

In the case of outputting a radio wave by a transmitter, there is a situation such that a gain of an amplifier changes due to a temperature or a variation in parts and the transmission output level changes. As a circuit and a method for preventing such a situation and for keeping the transmission output level of the transmitter to a predetermined level, what is called an ALC (Automatic Level Control) has been known.

An example of a conventional ALC apparatus for a burst signal and a method of setting the transmission output level will be described hereinbelow with reference to the drawings.

FIG. 6 shows a conventional ALC apparatus.

Reference numeral 61 denotes an input terminal to which a signal of a predetermined amplitude is inputted; 62 indicates a variable gain amplifier whose gain can be changed through a control terminal 621; 63 a detecting circuit for extracting and detecting a part of a voltage which is proportional to an output electric power of the variable gain amplifier 62; 64 an output terminal from which a burst signal is outputted; and 66 a reference waveform generating apparatus for outputting an envelope for the burst signal. In the reference waveform generating apparatus 66, reference numeral 661 denotes a controller; 662 indicates a counter; 663 an ROM (Read Only Memory); 664 a D/A converter; and 665 an LPF (Low Pass Filter). Reference numeral 65 denotes a comparison amplifier for amplifying a difference voltage between a voltage (hereinafter, referred to as a detection output voltage) detected by the detecting circuit 63 and an output voltage of the reference waveform generating apparatus 66. An output of the comparison amplifier 65 is connected to the control terminal 621 of the variable gain amplifier 62. Reference numeral 651 denotes a minus (−) terminal of the comparison amplifier 65 and 652 indicates a plus (+) terminal thereof.

The function to keep the predetermined transmission output level and the function to generate the burst signal in the conventional ALC apparatus in FIG. 6 will now be described.

The function to keep the predetermined transmission output level will be first described. For simplicity of explanation, it is now assumed that an output of the reference waveform generating apparatus 66 is set to a predetermined voltage and is unchanged.

The input signal of the predetermined amplitude which was inputted to the input terminal 61 is amplified by the variable gain amplifier 62. A part of an output electric power of the variable gain amplifier 62 is extracted and detected by the detecting circuit 63. The output of the reference waveform generating apparatus 66 is preset to the predetermined voltage corresponding to the predetermined transmission output level. The comparison amplifier 65 amplifies the difference voltage between the detection output voltage which was inputted to the (−) terminal 651 and the input voltage to the (+) terminal 652 and outputs a control voltage of the variable gain amplifier 62. The above loop constructs a negative feedback loop such that when the input voltage to the (−) terminal 651 increases, the output voltage of the comparison amplifier 65 decreases and when the input voltage to the (−) terminal 651 decreases, the output voltage of the comparison amplifier 65 increases. When the transmission output level is held constant and is stable, the difference voltage is set to almost zero (ideally, zero).

In this state, assuming that the input signal level to the input terminal 61 increased due to some causes, the output level of the variable gain amplifier 62 increases, the detection output voltage rises, and the input voltage to the (−) terminal 651 of the comparison amplifier 65 increases. Since the input voltage to the (+) terminal 652 does not change, the control voltage as an output of the comparison amplifier 65 decreases. The gain of the variable gain amplifier 62 decreases and the output level changes in the decreasing direction. The transmission output level is held constant owing to the function as mentioned above. Even in the case where the input signal level to the input terminal 61 decreased, the operation opposite to that mentioned above is performed, so that the transmission output level is always held constant.

It can be said that the input voltage to the (−) terminal 651 of the comparison amplifier 65 follows the input voltage to the (+) terminal 652 due to the above function. Therefore, when the transmission output level is varied, it is sufficient to change the input voltage to the (+) terminal 652 of the comparison amplifier 65. For instance, when the input voltage to the (+) terminal 652 increases, the control voltage of the variable gain amplifier 62 rises and the gain increases. Since the input signal level to the input terminal 61 is constant, the transmission output level increases. On the contrary, when the input voltage to the (+) terminal 652 is reduced, the transmission output level decreases.

In the case of shaping the transmission output waveform of the output terminal 64 into a burst-like shape, it is sufficient to periodically change the input signal waveform to the (+) terminal 652 in accordance with an envelope of a desired burst signal. Thus, the gain of the variable gain amplifier 62 periodically changes. Since the input signal level to the input terminal 61 is constant, the output waveform changes like a burst-shape.

The varying process of the transmission output level and the waveform shaping process of the burst signal are executed by the reference waveform generating apparatus 66. In this case, the information of the transmission output level and the information of the envelope of the burst signal are preliminarily stored into the ROM 663.

When a reference waveform is outputted, in the reference waveform generating apparatus 66, a clock signal is inputted from the controller 661 to the counter 662. Each time a clock signal pulse is inputted, the counter 662 counts it and sends the count value as address information to the ROM 663. The ROM 663 outputs a corresponding digital signal from the input address information to a digital input terminal of the D/A converter 664. The D/A converter 664 converts the digital signal which was inputted to the digital signal input terminal to the analog signal and outputs to the LPF 665. The LPF 665 smoothes an output signal from the D/A converter 664 and supplies the smoothed signal as a reference waveform to the (+) terminal 652 of the comparison amplifier 65. By previously writing the burst-shaped waveform data corresponding to the transmission output level into the ROM 663, the input voltage to the (+) terminal 652 of the comparison amplifier 65 changes in accordance with the waveform data. Since the input waveform to the (−) terminal 651 of the comparison amplifier 65 also changes in accordance with the input waveform to the (+) terminal 652, the transmission output waveform is shaped to the burst-shaped waveform data corresponding to the transmission output level written in the ROM 663.

FIG. 7 shows outputs of the respective sections when the burst signal waveform is shaped. When the output changes such that 71→72→73→74→75 each time of $t_1$, $t_2$, $t_3$, $t_4$, and $t_5$, an operating point of the control voltage to gain characteristics of the variable gain amplifier 62 changes such that 711→712→713→712→711. The transmission output waveform changes such that 76→77→78→79→710.

However, the construction as mentioned above has the following problems.

FIG. 8 is a diagram for explaining an influence by a resolution of the D/A converter. Reference numeral 84 denotes rising waveforms of two reference waveform generating apparatuses 66 having different transmission output levels (transmission output levels are set to $P_1$ and $P_2, P_1 > P_2$). Reference numeral 85 indicates output waveforms of the D/A converters 664. Reference numeral 81 denotes a minimum resolution e of the D/A converter. In the reference waveform generating apparatus, since the D/A converter is used at the final stage, the respective ratios of the minimum resolution e to the transmission output levels differ. ($e/P_1$ in the upper graph in the diagram and $e/P_2$ in the lower graph in the diagram: $e/P_1 < e/P_2$). Therefore, as the transmission output level decreases, it is difficult to execute the burst-shaped waveform shaping at a high fidelity.

On the other hand, since an ROM is generally used to store the reference waveform data, in the case of setting a plurality of transmission output levels, a large ROM capacity corresponding to such transmission output levels is needed.

SUMMARY OF THE INVENTION

In consideration of the above problems, it is an object of the present invention to provide a transmission output level control apparatus having an object such that even if a transmission output level of a burst signal is changed, the shaping process of a transmission output waveform is not influenced by the resolution of a D/A converter.

The following configuration and method are used to solve the above problems.

The invention comprises: a first variable gain amplifier whose gain can be varied by a first control voltage which is inputted to its control terminal; a second variable gain amplifier whose gain can be varied by a control voltage which is inputted to its control terminal; a detecting circuit for receiving an output electric power of the variable gain amplifier and for extracting and detecting a part of a voltage which is proportional to the output electric power; an attenuator which receives a detection output voltage of the detecting circuit and can output at an arbitrary attenuation ratio; a reference waveform generating apparatus for outputting an envelope for a burst signal; a comparison amplifier which amplifies a difference voltage between an output voltage of the attenuator and an output voltage of the reference waveform generating apparatus and whose output is connected to the control terminal of the first variable gain amplifier; a second control unit for controlling the control voltage of the second variable gain amplifier and an attenuation ratio of the attenuator; and an output terminal for outputting a burst waveform from the detecting circuit.

When the transmission output level is changed, the attenuation ratio of the attenuator is changed. The case where the attenuation ratio was set to a large value will now be considered. In such a case, the input voltage to the (−) terminal of the comparison amplifier decreases and the output voltage of the comparison amplifier increases. The gain of the variable gain amplifier connected to the comparison amplifier increases, the output electric power increases, and the transmission output level rises. On the contrary, when the attenuation ratio of the attenuator is set to a small value, the transmission output level decreases.

At the same time, by operating the control unit, the control voltage of the variable gain amplifier is increased in the case of increasing the attenuation ratio and the control voltage is reduced in the case of decreasing the attenuation ratio. Thus, when the gain of the second variable gain amplifier which is operated by the control unit between the two variable gain amplifiers is reduced with the transmission output level held constant, the gain of the other variable gain amplifier increases. When the gain of the second variable gain amplifier is increased, the gain of the first variable gain amplifier decreases. Therefore, when the transmission output level changes, a predetermined control voltage is applied to the second variable gain amplifier and the operating conditions of the first variable gain amplifier are made constant. Therefore, there is no need to change the output level of the reference waveform generating apparatus.

Therefore, by changing the control voltage of the control terminal simultaneously with changing of the attenuation ratio of the attenuator by the control unit, the transmission output level of the burst signal can be varied without changing the output waveform of the reference waveform generating apparatus.

BRIEF DESCRIPTION OF THE DRAWINGS

FIG. 1 is a circuit diagram of an apparatus for controlling a transmission output level in the first embodiment of the invention;

FIG. 2 is a characteristic graph of the gain to the control voltage of a variable gain amplifier 1;

FIG. 3 is a characteristic graph of the gain to the control voltage of a variable gain amplifier 2;

FIG. 4 shows operating points of respective sections when a transmission output is variable;

FIG. 5 shows output waveforms of respective sections in FIG. 1,

FIG. 7 shows a reference waveform and corresponding output waveform of the apparatus shown in FIG. 1 and controlled for shaping its burst signal with a control voltage versus gain characteristic; and FIG. 8 shows resolution of a D/A converter used in the apparatus of FIG. 1.

DESCRIPTION OF THE PREFERRED EMBODIMENTS

Figure 6:
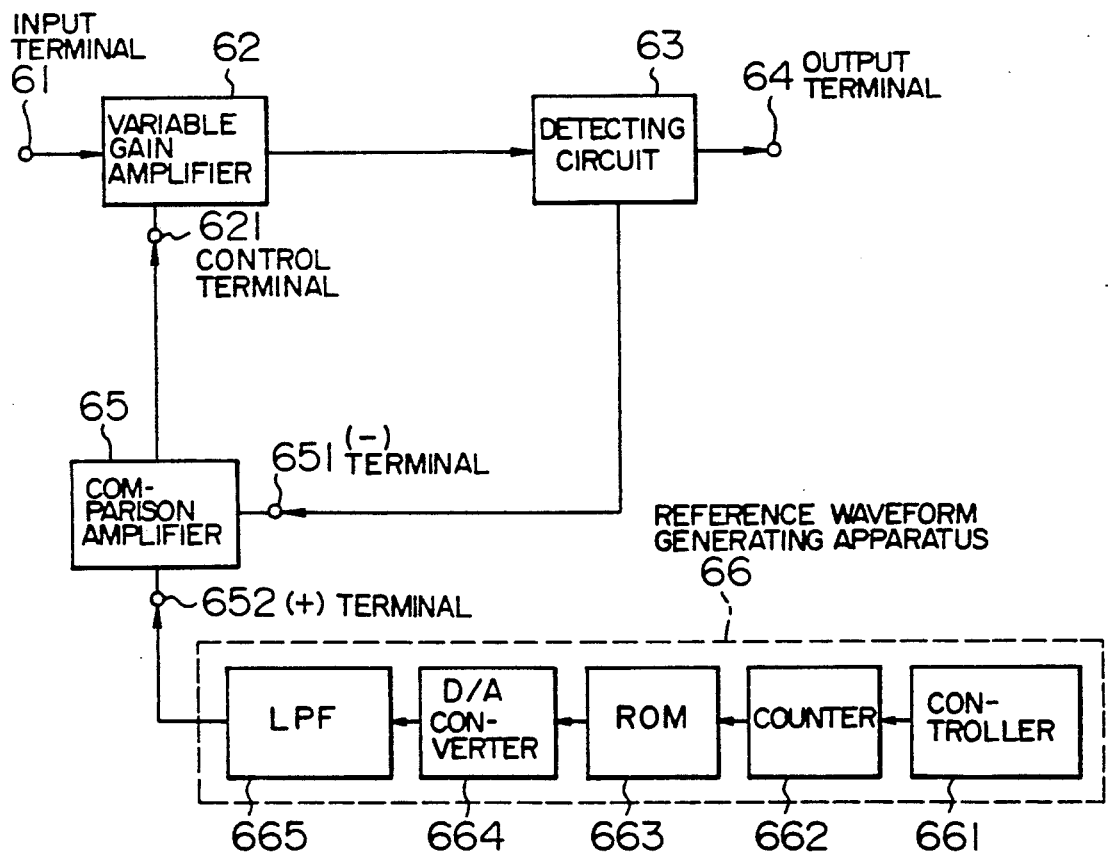
FIG. 6 shows a conventional ALC apparatus.

An apparatus for controlling transmission output level according to an embodiment of the present invention will be described hereinbelow with reference to the drawings.

FIG. 1 is a circuit diagram of a transmission output level control apparatus showing the first embodiment of the invention. In FIG. 1, reference numeral 11 denotes an input terminal to which a signal of a predetermined amplitude is inputted; 12 a variable gain amplifier 1 whose gain can be varied by a control voltage which is applied to a control terminal 121; 13 a variable gain amplifier 2 which receives an output electric power of the variable gain amplifier 12 and whose gain can be varied by a control voltage which is applied to a control terminal 131; 14 a detecting circuit receives an output electric power of the variable gain amplifier 2 and extracts and detects a part of a voltage which is proportional to the output electric power; 15 an output terminal from which a burst signal is outputted; and 17 an attenuator using a D/A converter. A detection output voltage of the detecting circuit 14 is inputted to a reference signal terminal 171. The attenuator 17 sets an attenuation ratio by a signal which is inputted to a digital signal input terminal 172 and outputs the attenuated output voltage from an analog output terminal 173. Reference numeral 18 denotes a control unit comprising: a controller 181; a D/A converter 183 whose analog output terminal is connected to the control terminal 131; a ROM 182 in which control voltage information corresponding to a predetermined transmission output level which is given to the variable gain amplifier 2 is stored; and a ROM 184 in which information of an attenuation ratio corresponding to a predetermined transmission output level which is given to the attenuator 17 is stored. Reference numeral 16 denotes a reference waveform generating apparatus comprising: a controller 161 to output a clock signal; a counter 162; a ROM 163; a D/A converter 164; and a low pass filter 165. Reference numeral 19 denotes a comparison amplifier. A voltage from the analog output terminal 173 of the attenuator 17 is inputted to a (−) terminal 191 of the comparison amplifier 19 and an output voltage of the reference waveform generating apparatus 16 is inputted to a (+) terminal 192. An output of the comparison amplifier 19 is connected to the control terminal 121 of the variable gain amplifier 12.

FIG. 2 is a characteristic graph of the gain to the control voltage of the variable gain amplifier 12. FIG. 3 is a characteristic graph of the gain to the control voltage of the variable gain amplifier 13.

The operation of the transmission output level control apparatus constructed as mentioned above will now be described hereinbelow by using FIGS. 1 to 3.

The transmission output level control apparatus has a function to keep a predetermined transmission output level constant, a function to shape a transmission output waveform into a burst shape, and a function to variably change the transmission output level without changing the output waveform of the reference waveform generating apparatus.

The function to keep the predetermined transmission output level will be first described. For simplicity of explanation, it is now assumed that the output of the reference waveform generating apparatus 16 is set to a predetermined voltage and is unchanged.

The input signal of the predetermined amplitude which was inputted to the input terminal 11 is amplified by the variable gain amplifiers 12 and 13. A part of an output electric power is extracted and detected by the detecting circuit 14. The output of the reference waveform generating apparatus 16 is preset to a predetermined voltage corresponding to a predetermined transmission output level. The comparison amplifier 19 amplifies a which was inputted to the (−) terminal 191 and the input voltage to the (+) terminal 192 and outputs a control voltage of the variable gain amplifier 12. The above loop forms a negative feedback loop such that the output voltage of the comparison amplifier 19 decreases when the input voltage to the (−) terminal 191 increases and the output voltage increases when the input voltage to the (−) terminal 191 decreases. When the transmission output level is stable, the difference voltage is set to almost zero (ideally, zero).

In the above state, if the input signal level to the input terminal 11 increased due to some causes, the output level of the variable gain amplifier 12 rises and the gain of the variable gain amplifier 13 does not change. Thus, the detection output voltage increases and the input voltage to the (−) terminal 191 of the comparison amplifier 19 increases. Since the input voltage to the (+) terminal 192 does not change, the control voltage as an output of the comparison amplifier 19 decreases. The gain of the variable gain amplifier 12 decreases and the output level changes in the decreasing direction. Due to such operation, the transmission output level is held constant. Even in the case where the input signal level to the input terminal 11 decreased, the operation opposite to that mentioned above is performed, so that the transmission output level is always held constant. Waveforms of the respective sections when the transmission output level is held constant are shown by reference numerals 110, 111, 112, 113, and 114 in FIG. 5.

From the above operation, it can be said that the input voltage to the (−) terminal 191 of the comparison amplifier 19 follows the input voltage to the (+) terminal 192.

When the transmission output level is made variable, in the example of the conventional ALC apparatus, the input voltage to the (+) terminal 192 of the comparison amplifier 19 has been made variable. However, in the embodiment, the attenuator 17 is provided and the transmission output level has been changed by attenuating the detection output voltage at an arbitrary attenuation ratio. For instance, the case where the operating point of the variable gain amplifier 1 is located at 21 in FIG. 2 and the attenuation ratio of the attenuator 17 was increased in this state will now be considered. Due to this, since the input voltage to the (−) terminal 191 of the comparison amplifier 19 is lower than the input voltage to the (+) terminal 192, the output voltage of the comparison amplifier 19 changes in the increasing direction. The operating point of the variable gain amplifier 12 moves from 21 to 22 in FIG. 2 and the gain increases. Since the input signal level to the input terminal 11 is constant, the output level of the gain amplifier 12 increases. Since the gain of the gain amplifier 13 does not change, the detection output voltage of the detecting circuit 14 also increases. The voltage which is inputted to the (−) terminal 191 of the comparison amplifier 19 through the attenuator 17 also increases and becomes stable in a state in which it is equal to the input voltage to the (+) terminal 192. This results in an increase in the transmission output level. On the contrary, when the attenuation ratio of the attenuator 17 was reduced, the transmission output level decreases.

In the case of using a D/A converter for the attenuator, a bit signal corresponding to the predetermined transmission output level is sent from the controller 181 to the ROM 184. The ROM 184 outputs the digital signal corresponding to the bit signal to the digital input terminal 172 of the D/A converter of the attenuator 17. The attenuation ratio which is determined by the digital signal assumes 1/R. Assuming that the detection output voltage which was inputted to the reference signal terminal 171 is set to $V_r$, an output voltage $V_0$ from the analog signal output terminal 173 is set to $V_0 = v_r/R$. Therefore, by operating the bit signal which is sent from the controller 181 to the ROM 184, the value of 1/R is changed and the attenuation ratio is changed.

In the case of shaping the transmission output waveform of the output terminal 15 to a burst-like shape, it is sufficient to periodically change the input signal waveform to the (+) terminal 192 in accordance with an envelope of a desired burst signal. Thus, the gain of the variable gain amplifier 12 periodically changes. Since the input signal level to the input terminal 11 is constant, the output waveform changes like a burst. In the case of the conventional example, the burst waveform has been outputted from the reference waveform generating apparatus every transmission output level. However, in the case of the FIG. 1 embodiment, since the transmission output level can be varied by the attenuator 17, it is sufficient to merely output one burst waveform.

The waveform shaping of the burst signal is executed by the reference waveform generating apparatus 16. In this case, the information of the envelope of the burst signal is stored into the ROM 163.

When the reference waveform is outputted, in the reference waveform generating apparatus 16, a clock signal is inputted from the controller 161 to the counter 162. Each time the clock signal pulse is inputted, the counter 162 counts it and sends the count value as address information to the ROM 163. The ROM 163 outputs the corresponding digital signal from the input address information to the digital input terminal of the D/A converter 164. The D/A converter 164 converts the digital signal which was inputted to the digital signal input terminal into the analog signal and outputs to the low pass filter 165. The LPF 165 smoothes the output signal from the D/A converter 164 and supplies the smoothed signal as a reference waveform to the (+) terminal 192 of the comparison amplifier 19. By writing the burst-shaped waveform data into the ROM 163, the input voltage to the (+) terminal 192 of the comparison amplifier 19 changes in accordance with the waveform data. Since the input waveform to the (−) terminal 191 of the comparison amplifier 19 also changes in accordance with the input waveform to the (+) terminal 192, the transmission output waveform is shaped into the burst-shaped waveform data written in the ROM 163.

When the transmission output level changes, the waveform shaping to the burst signal is influenced by the control voltage to gain characteristics (FIG. 2) of the gain amplifier 12. The motion of the operating point of the gain amplifier 12 at a certain transmission output level will now be described as an example. FIG. 4 shows changes in the output of the reference waveform generating apparatus 16 when waveform shaping it into the burst signal, the transmission output waveform of the output terminal, and control voltage operating point of the variable gain amplifier 12. When the output waveform of the reference waveform generating apparatus 16 changes such that 41→42→43→44→45 at times of $t_1, t_2, t_3, t_4,$ and $t_5$, the control voltage operating point of the variable gain amplifier 12 changes such that 411→412→413 →412→411. A difference 415 of the attenuation amounts between 411 and 413 corresponds to a difference 417 of the attenuation amounts of the burst signals. When the transmission output level increased, if the output waveform of the reference waveform generating apparatus 16 changes such that 41→42→43→44→45, the control voltage operating point of the variable gain amplifier 12 changes such that 412→413→414→413→412. In this case, in spite of the fact that it is desired to obtain a similar attenuation amount of the burst signal, since the gain characteristic of the variable gain amplifier 12 is not linear, the attenuation amount decreases from 415 to 416. Therefore, the attenuation amount of the transmission output waveform at the output terminal also decreases. To eliminate this influence, according to the invention, by changing the control voltage of the gain amplifier 13, even if the transmission output level is changed, the operating point of the variable gain amplifier 12 operates in the same range. The above function will now be described.

It is now assumed that the transmission output level is preset to a predetermined value and the operating point of the gain amplifier 12 is located at 22 in FIG. 2 and the operating point of the variable gain amplifier 13 is located at 31 in FIG. 3. The bit signal is sent from the controller 181 to the ROM 182. The ROM 182 sends the digital signal corresponding to the bit signal to the D/A converter 183. The D/A converter 183 converts the digital signal into the analog signal and outputs as a control voltage to the control terminal 131 of the variable gain amplifier 13. When considering the case where the control voltage of the variable gain amplifier 13 was increased by the controller 181, the next moment the operating point in FIG. 3 moves from 31 to 32, the gain of the variable gain amplifier 13 increases, and the output electric power increases. Thus, the detection output voltage of the detecting circuit 14 also increases. In the comparison amplifier 19, since the input voltage to the (−) terminal 191 is larger than the input voltage to the (+) terminal 192, the output voltage decreases. The operating point in FIG. 2 moves from 22 to 21 and the gain of the variable gain amplifier 12 decreases. The transmission output level from the output terminal 15 does not change. On the contrary, when the control voltage of the control terminal 131 was reduced, the gain of the variable gain amplifier 12 increases. By providing the control unit and operating the control voltage of the variable gain amplifier 13 as mentioned above, the gain of the variable gain amplifier 12 can be adjusted without changing the transmission output level.

Therefore, by increasing the attenuation ratio of the attenuator 17 by the control unit 181 and also simultaneously increasing the control voltage of the variable gain amplifier 13 by a predetermined voltage, the operating point of the control voltage of the variable gain amplifier 12 can be always held constant. In such a case, the information of the predetermined attenuation ratio is stored into the ROM 184 every transmission output level and the predetermined control voltage information of the variable gain amplifier 13 is stored into the ROM 183.

Due to this, there is no need to change the output waveform of the reference waveform generating apparatus every transmission output level and even if the transmission output level changes, a desired attenuation amount is obtained.

In the embodiment of FIG. 1, the variable gain amplifier 12 can be also arranged after the variable gain amplifier 13.

On the other hand, in the embodiment of FIG. 1, although the control unit 18 executes both of the control of the attenuator 17 and the control of the control voltage of the variable gain amplifier 13, those controls can be also separately performed by different control units.

Reference marks or numerals used in the foregoing explanation are identified below.

11 ... input terminal, 12 ... variable gain amplifier 1, 121 ... control terminal, 13 ... variable gain amplifier 2, 131 ... control terminal, 14 ... detecting circuit, 15 ... output terminal, 16 ... reference waveform generating apparatus, 161 ... controller 162 ... counter, 163 ... ROM, 164 ... D/A converter, 165 ... low pass filter, 17 ... attenuator, 171 ... reference input terminal, 172 ... digital input terminal, 173 ... analog output terminal, 18 ... control unit, 181 ... controller, 182 ... ROM, 183 ... D/A converter, 184 ... ROM, 19 ... comparison amplifier, 191 ... (−) terminal, 192 ... (+) terminal, 21 ... operating point 1, 22 ... operating point 2, 31 ... operating point 1, 32 ... operating point 2, 418 ... output waveform of reference waveform generating apparatus, 419 ... output waveform of output terminal, 420 ... gain characteristics versus control voltage of variable gain amplifier, 61 ... input terminal, 62 ... variable gain amplifier 621 ... control terminal, 63 ... detecting circuit, 64 ... output terminal, 65 ... comparison amplifier, 651 ... (−) terminal, 652 ... (+) terminal, 66 ... reference waveform generating apparatus, 661 ... controller, 662 ... counter, 663 ... ROM, 664 ... D/A converter, 665 ... low pass filter, 714 ... output waveform of reference waveform generating apparatus, 715 ... output waveform at output terminal, 716 ... gain characteristics versus control voltage of the variable gain amplifier.

We claim:

1. An apparatus for controlling a transmission output level for a burst signal, comprising:
   a first variable gain amplifier having an input terminal for receiving a signal of a predetermined amplitude and whose gain can be varied by a control voltage which is inputted to a first control terminal;
   a second variable gain amplifier whose gain can be varied by a control voltage which is inputted to a second control terminal;
   a detecting circuit to which the first variable gain amplifier and the second variable gain amplifier are cascade connected such that an output electric power of the second variable gain is inputted to said detecing circuit and which extracts and detects a part of a voltage which is proportional to said output electric power;
   an attenuator which receives the voltage detected by the detecting circuit and provides an output voltage at an arbitrary attenuation ratio;
   a reference waveform generating device for outputting an output voltage providing an envelope for a burst signal;
   a comparison amplifier for providing a control voltage comprising an amplified difference voltage between said output voltage of the attenuator and said output voltage of the reference waveform generating apparatus to the control terminal of the first variable gain amplifier;
   a control unit for controlling the control voltage applied to the control terminal of the second variable gain amplifier and the attenuation ratio of the attenuator; and
   an output terminal for outputting a burst waveform from the detecting circuit,
   whereby the attenuation ratio of the attenuator and the control voltage applied to the second variable gain amplifier are simultaneously changed by the control unit and a transmission output level of the burst signal of the first variable gain amplifier cna be varied without changing an output waveform of the reference waveform generating apparatus.

2. An apparatus according to claim 1, wherein said attenuator comprises a D/A convertor having a reference input terminal and the voltage detected by the detecting circuit is inputted to a reference signal input terminal of the D/A convertor and an analog signal output terminal of the D/A convertor is connected to one input terminal of the comparison amplifier, whereby the attenuation ratio is set by operating a signal which is given to a digital signal input terminal of the D/A converter.

3. An apparatus according to claim 2, wherein said control unit comprises a D/A convertor and a ROM, an output of the D/A convertor of the control unit is connected to the control terminal of the second variable gain amplifier, a ROM is connected to a digital input terminal of the D/A converter of the control unit, the control voltage of the second variable gain amplifier is controlled from a controller and, further, a ROM is connected to a digital input terminal of the D/A converter of the attenuator to set the attenuation ratio.

4. An apparatus for controlling a transmission output level for a burst signal, comprising:
   a first variable gain amplifier whose gain can be varied by a control voltage which is inputted to a first control terminal;
   a second variable gain amplifier whose gain can be varied by a control voltage which is inputted to a second control terminal, one of said first variable gain amplifier and said second variable gain amplifier having an input temrinal for receiving a signal of a predetermined amplitude inputted to a second control terminal and;
   a detecting circuit to which the first variable gain amplifier and the second variable gain amplifier are cascade connected such that an output electric power of the second variable gain is inputted to said detecing circuit and which extracts and detects a part of a voltage which is proportional to said output electric power;
   an attenuator which receives the voltage detected by the detecting circuit and provides an output voltage at an arbitrary attenuation ratio;
   a reference waveform generating device for outputting an output voltage providing an envelope for a burst signal;

a comparison amplifier for providing a control voltage comprising an amplified difference voltage between said output voltage of the attenuator and said output voltage of the reference waveform generating apparatus to the control terminal of said one of the first variable gain amplifier and said second variable gain amplifier;

a control unit for controlling the control voltage applied to the control terminal of the other one of said first variable gain amplifier and the second variable gain amplifier and the attenuation ratio of the attenuator; and an output terminal for outputting a burst waveform from the detecting circuit, whereby the attenuation ratio of the attenuator and the control voltage applied to the second variable gain amplifier and the second variable gain amplifier are simultaneously changed by the control unit and a transmission output level of the burst signal can be varied without changing an output waveform of the reference waveform generating apparatus.

5. An apparatus according to claim 4, wherein said attenuator comprises a D/A convertor having a reference input terminal and the voltage detected by the detecting circuit is inputted to a reference signal input terminal of the D/A convertor and an analog signal output terminal of the D/A convertor is connected to one input terminal of the comparison amplifier, whereby the attenuation ratio is set by operating a signal which is given to a digital signal input terminal of the D/A converter.

6. An apparatus according to claim 5, wherein said control unit comprises a D/A convertor and a ROM, an output of the D/A convertor of the control unit is connected to the control terminal of said other one of said first varaible gain amplifier and said second variable gain amplifier, a ROM is connected to a digital input terminal of the D/A converter of the control unit, the control voltage of said other one of said first variable gain amplifier and the second variable gain amplifier is controlled by a controller and, further, a ROM is connected to a digital input terminal of the D/A converter of the attenuator to set the attenuation ratio.

* * * * *